US012672465B2

(12) United States Patent
Cheng et al.

(10) Patent No.: US 12,672,465 B2
(45) Date of Patent: Jun. 30, 2026

(54) DISPLAY DEVICE INCLUDING A BUMP WITH LOW WATER VAPOR TRANSMISSION RATE

(71) Applicant: E Ink Holdings Inc., Hsinchu (TW)

(72) Inventors: Yuan-Hsun Cheng, Hsinchu (TW); Tsai-Wei Shei, Hsinchu (TW); Yen-Ze Huang, Hsinchu (TW); Yi-Hung Chen, Hsinchu (TW); Jen-Shiun Huang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 420 days.

(21) Appl. No.: 18/177,117

(22) Filed: Mar. 2, 2023

(65) Prior Publication Data

US 2023/0320174 A1     Oct. 5, 2023

(30) Foreign Application Priority Data

Mar. 29, 2022    (TW) .................................. 111111793

(51) Int. Cl.
H10K 59/80          (2023.01)
H10K 59/127         (2023.01)

(52) U.S. Cl.
CPC ....... H10K 59/871 (2023.02); H10K 59/1275 (2023.02)

(58) Field of Classification Search
CPC ............. H10K 59/871; H10K 59/8722; H10K 50/8426
See application file for complete search history.

(56) References Cited

U.S. PATENT DOCUMENTS

| | | | | |
|---|---|---|---|---|
| 5,717,476 | A | * | 2/1998 | Kanezawa ............ G02F 1/1339 349/149 |
| 8,771,459 | B2 | | 7/2014 | Keite-Telgenbuscher et al. |
| 9,087,488 | B1 | | 7/2015 | Zehner |
| 9,862,176 | B1 | | 1/2018 | Zehner |

(Continued)

FOREIGN PATENT DOCUMENTS

| | | |
|---|---|---|
| CN | 102096263 | 6/2011 |
| CN | 103913921 | 7/2014 |

(Continued)

OTHER PUBLICATIONS

Hsu (Deposition of Silicon-Based Stacked Layers for Flexible Encapsulation of Organic Light Emitting Diodes), 2019, Nanomaterials, 9, 1053, p. 3 (Year: 2019).*

(Continued)

*Primary Examiner* — Chad M Dicke
*Assistant Examiner* — Jeremy Daniel Watts
(74) *Attorney, Agent, or Firm* — JCIPRNET

(57)          ABSTRACT

A display device includes a first substrate, a second substrate, a display layer, a bump, and a sealing material. The second substrate is disposed over the first substrate. The display layer is disposed between the first substrate and the second substrate, and has a boundary. The bump is connected to the first substrate or the second substrate and protrudes in a direction toward the opposite second substrate or first substrate, and is disposed around the boundary. The sealing material is filled between the bump and the display layer. The water vapor transmission rate of the bump is less than the water vapor transmission rate of the sealing material.

9 Claims, 5 Drawing Sheets

100c

(56)          References Cited

U.S. PATENT DOCUMENTS

| | | | |
|---|---|---|---|
| 9,935,289 B2 | 4/2018 | Chen et al. | |
| 2009/0115942 A1* | 5/2009 | Watanabe | G02F 1/1339 349/96 |
| 2014/0139985 A1* | 5/2014 | Shih | H05K 5/063 361/679.01 |
| 2016/0204379 A1 | 7/2016 | Chen et al. | |
| 2016/0218320 A1 | 7/2016 | Chen et al. | |
| 2021/0325758 A1 | 10/2021 | Huang et al. | |

FOREIGN PATENT DOCUMENTS

| | | |
|---|---|---|
| CN | 105609660 | 5/2016 |
| CN | 209962062 | 1/2020 |
| CN | 110879493 | 3/2020 |
| CN | 111190310 | 5/2020 |
| CN | 113534560 | 10/2021 |
| CN | 114141847 | 3/2022 |
| JP | 2011150112 | 8/2011 |
| KR | 20160053335 | 5/2016 |
| KR | 20200069938 | 6/2020 |
| TW | 200702782 | 1/2007 |
| TW | 201220262 | 5/2012 |
| TW | 201547080 | 12/2015 |

OTHER PUBLICATIONS

Kovacs (Water vapor transmission properties of acrylic organic coatings), 2020, Department of Solid State Physics, Faculty of Sciences and Technology, University of Debrecen, 18, p. 533 (Year: 2020).*

"Office Action of China Counterpart Application", issued on Apr. 1, 2026, pp. 1-7.

* cited by examiner

I      I

100

100c

DISPLAY DEVICE INCLUDING A BUMP WITH LOW WATER VAPOR TRANSMISSION RATE

CROSS-REFERENCE TO RELATED APPLICATION

This application claims the priority benefit of Taiwan application serial no. 111111793, filed on Mar. 29, 2022. The entirety of the above-mentioned patent application is hereby incorporated by reference herein and made a part of this specification.

BACKGROUND

Technical Field

The disclosure relates to a display device.

Description of Related Art

For a display layer that includes a water vapor-sensitive material, external water vapor may easily affect its performance. Although a glass substrate and a sealing material of a display device can block water vapor, in order to achieve a better waterproof effect, it is necessary to further adopt a means to reduce the water vapor transmission rate. Coating a waterproof material outside the display layer including the water vapor-sensitive material is a technique of blocking water vapor. However, some existing waterproof materials with a low water vapor transmission rate are not easy to be coated. Therefore, there is still room for improvement in terms of the water vapor barrier effect of the display device.

SUMMARY

The disclosure provides a display device with an improved water vapor barrier effect.

According to an embodiment of the disclosure, a display device includes a first substrate, a second substrate, a display layer, a bump, and a sealing material. The second substrate is disposed over the first substrate. The display layer is disposed between the first substrate and the second substrate, and has a boundary. The bump is connected to the first substrate or the second substrate and protrudes in a direction toward the opposite second substrate or first substrate, and is disposed around the boundary. The sealing material is filled between the bump and the display layer. A water vapor transmission rate of the bump is less than a water vapor transmission rate of the sealing material.

Based on the above, in the display device according to the embodiment of the disclosure, the water vapor transmission rate of the bump is less than the water vapor transmission rate of the sealing material, which reduces the water vapor that penetrates into the display layer from outside and improves the water vapor barrier effect of the display device.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
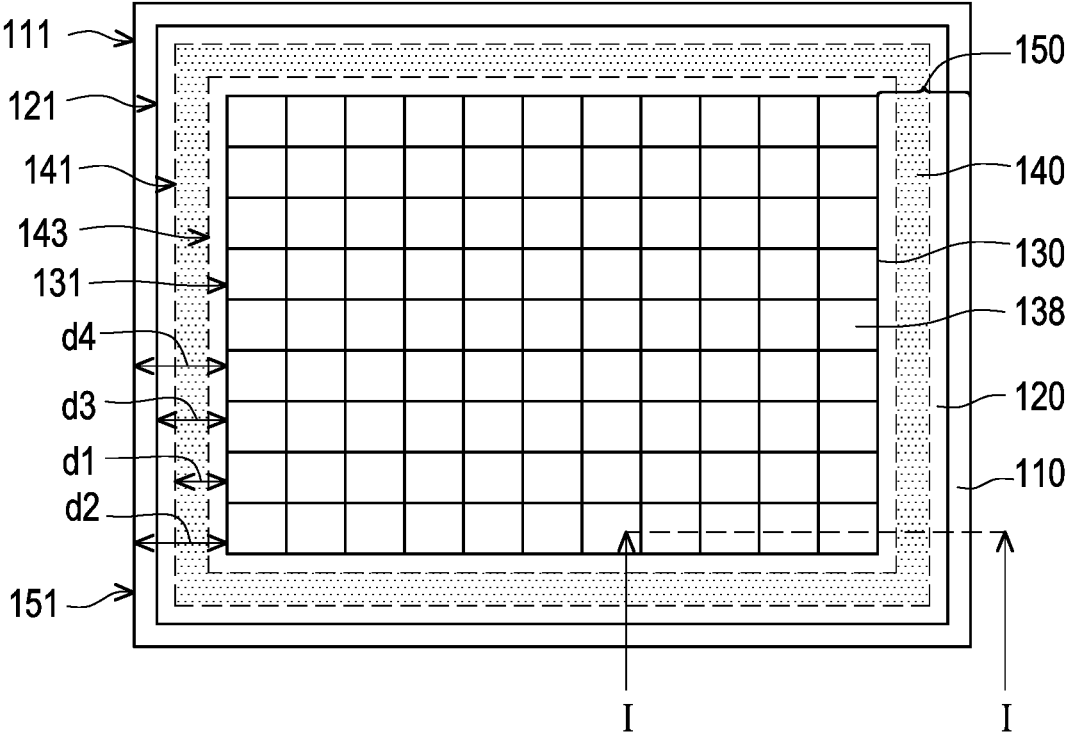
FIG. 1 is a schematic top view of some components of a display device according to an embodiment of the disclosure.
Figure 2:
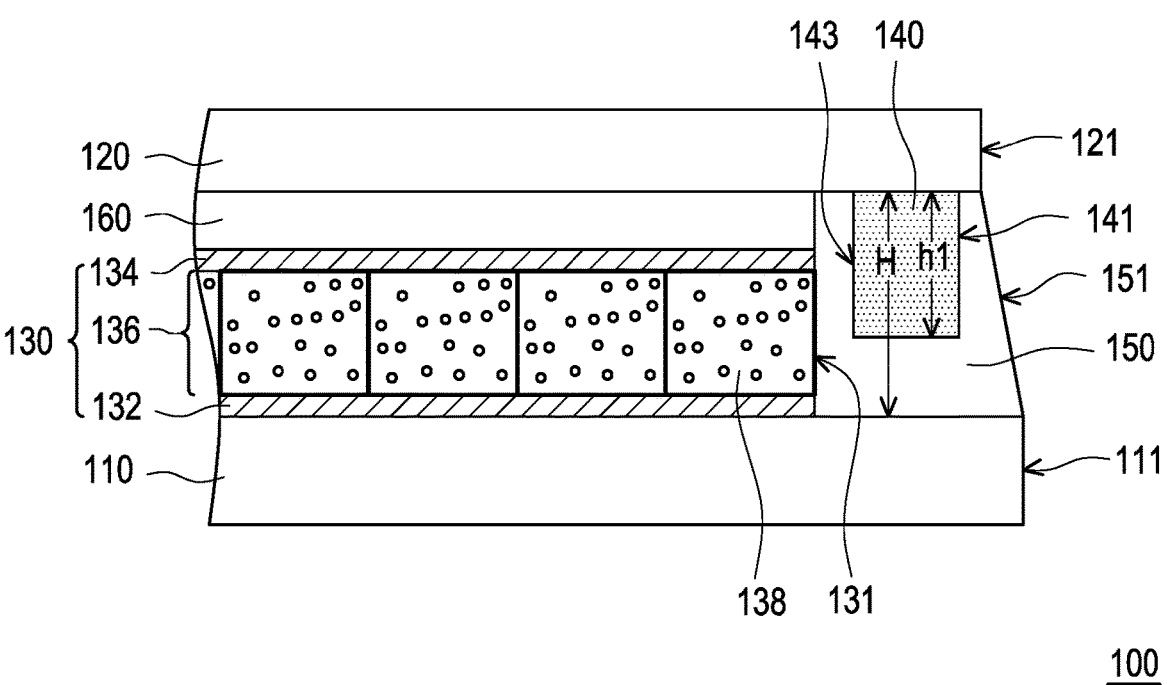
FIG. 2 is a schematic cross-sectional view of the display device of FIG. 1 cut along the line I-I.

FIG. 1 is a schematic top view of some components of a display device according to an embodiment of the disclosure. FIG. 2 is a schematic cross-sectional view of the display device of FIG. 1 cut along the line I-I. Please refer to FIG. 1 and FIG. 2. For convenience of description, some components of a display device 100 are omitted from FIG. 1. In this embodiment, the display device 100 includes a first substrate 110, a second substrate 120, a display layer 130, a bump 140, and a sealing material 150. The second substrate 120 is disposed over the first substrate 110. The display layer 130 is disposed between the first substrate 110 and the second substrate 120 and includes a plurality of pixel units 138. The display layer 130 has a boundary 131 and each pixel unit 138 located at an edge of the display layer 130 defines the boundary 131 of the display layer 130. The bump 140 is connected to the second substrate 120 and protrudes in a direction toward the opposite first substrate 110. The bump 140 is disposed between the first substrate 110 and the second substrate 120. The sealing material 150 is filled between the bump 140 and the display layer 130 and between the bump 140 and the first substrate 110 or the second substrate 120 such that the first substrate 110, the second substrate 120, the bump 140, and the sealing material 150 together cover the display layer 130 and seal the display layer 130. The bump 140 has a first sidewall 141 away from the display layer 130, and the sealing material 150 has a second sidewall 151 away from the display layer 130. A distance d1 between the first sidewall 141 and the boundary 131 is less than or equal to a distance d2 between the second sidewall 151 and the boundary 131. In addition, a water vapor transmission rate of the bump 140 is less than a water vapor transmission rate of the sealing material 150. Accordingly, the bump 140 helps to improve the lateral water vapor blocking capability, which prevents water vapor from causing adverse effects to the display layer 130 and thereby ensures the quality and service life of the display device 100.

In the embodiment of FIG. 1 and FIG. 2, for example, the distance d1 between the first sidewall 141 and the boundary 131 is less than the distance d2 between the second sidewall 151 and the boundary 131, and a distance d3 between a sidewall 121 of the second substrate 120 and the boundary 131 is less than a distance d4 between a sidewall 111 of the first substrate 110 and the boundary 131. In other words, according to the top view of FIG. 1, the sidewall 111 of the first substrate 110 is located outside the sidewall 121 of the second substrate 120, or the sidewall 121 of the second substrate 120 is located between the sidewall 111 of the first substrate 110 and the boundary 131 of the display layer 130.

The bump 140 and the sealing material 150 are both disposed between the sidewall 111 of the first substrate 110 and the boundary 131 of the display layer 130, for example.

In this embodiment, an orthographic projection area of the bump 140 on the first substrate 110 is located within an orthographic projection area of the sealing material 150 on the first substrate 110. That is, the sealing material 150 is not only filled between the bump 140 and the display layer 130 but also extends beyond the first sidewall 141 (for example, the sealing material 150 also extends between the bump 140 and the sidewall 111 of the first substrate 110). In the cross-sectional view of FIG. 2, the second sidewall 151 of the sealing material 150 is shown as having a straight edge and connected between the sidewall 111 of the first substrate 110 and the sidewall 121 of the second substrate 120. However, in practical applications, a sidewall profile of the sealing material 150 and the relationship between the sidewall profile of the sealing material 150 and the sidewall 111 and the sidewall 121 may vary due to the materials or manufacturing conditions. For example, when the sealing material 150 is filled, the sidewall profile of the sealing material 150 may have curvature due to the fluidity of the filled material, and a concave or convex arc-shaped sidewall may be formed between the sidewall 111 of the first substrate 110 and the sidewall 121 of the second substrate 120. In this embodiment, the first sidewall 141 of the bump 140 is, for example, an outer sidewall, and the bump 140 has an inner sidewall 143 opposite to the first sidewall 141. In addition, the sealing material 150 covers at least a part of the first sidewall 141, and the sealing material 150 covers most of the inner sidewall 143. The inner sidewall 143 and the first sidewall 141 of the bump 140 are located outside the boundary 131 of the display layer. Therefore, the bump 140 is disposed around the boundary 131 of the display layer 130. As shown in FIG. 1, the bump 140 may be formed with a complete and unbroken annular pattern to serve as an annular water vapor barrier reinforcing structure, but the disclosure is not limited thereto.

In this embodiment, the first substrate 110 and the second substrate 120 are, for example, glass substrates, circuit boards or other rigid substrates. The material of the bump 140 is, for example, glass frit, glass, ceramic or metal, but not limited thereto. As shown in FIG. 2, the bump 140 may be connected to the second substrate 120, and the bump 140 may protrude from the second substrate 120 toward the first substrate 110 without contacting the first substrate 110. Accordingly, the sealing material 150 may be filled between the bump 140 and the first substrate 110.

In an embodiment, the second substrate 120 is a glass substrate, and the bump 140 is connected to the second substrate 120. At this time, glass frit may be formed on the second substrate 120 at a position where the bump 140 is to be formed (for example, a peripheral area), and then heated so as to bond the glass frit and the second substrate 120 to form the bump 140. The heating process may sinter the glass frit on the second substrate 120. During the heating process, the formed bump 140 may be slightly arc-shaped at an end away from the second substrate 120 due to loss of water vapor and other substances in the glass frit. Since the glass frit (bump 140) and the glass (the second substrate 120) can form a strong bond therebetween, the bump 140 directly contacts and is connected to the second substrate 120. Accordingly, the bump 140 and the second substrate 120 are not connected through a third material. The formed bump 140 and the second substrate 120 do not have an obvious water vapor penetration path therebetween, which improves the water vapor barrier effect in the lateral direction.

In addition, in the manufacturing process of the display device 100, the bump 140 may be formed on the second substrate 120 first, and then the second substrate 120 may be attached to the display layer 130. In this way, the heat generated when the glass frit is sintered is prevented from affecting the materials in the display layer 130 or the elements and/or materials in the first substrate 110. However, the disclosure is not limited thereto. In other embodiments, the bump 140 may be selectively fabricated on the first substrate 110.

In this embodiment, as shown in FIG. 2, the display layer 130 includes a first electrode 132, a second electrode 134, and a display medium layer 136. The second electrode 134 is disposed over the first electrode 132. The display medium layer 136 is disposed between the first electrode 132 and the second electrode 134. In some embodiments, the first electrode 132 may be an electrode layer fabricated on the first substrate 110, and besides the first electrode 132, an active element (not shown) that constitutes a driving circuit may be formed on the first substrate 110. The second electrode 134 may be an electrode layer fabricated on the display medium layer 136 or an externally attached electrode film. The display medium layer 136 may be a water vapor-sensitive material. In some embodiments, the display medium layer 136 includes, for example, an electrophoretic display medium or an electrowetting display medium in the form of a microcup, microcapsule, etc., but not limited thereto. The display medium layer 136 may also be an organic light emitting diode (OLED) or other display mediums. In this embodiment, the display device 100 further includes an optical adhesive layer 160 disposed between the display layer 130 and the second substrate 120. The optical adhesive layer 160 may be used to attach the second substrate 120 to the display layer 130.

In this embodiment, the water vapor transmission rate of the sealing material 150 is 5 g/m²/day to 15 g/m²/day, and the water vapor transmission rate of the bump 140 is less than 10 g/m²/day, for example, 0.1 g/m²/day to 10 g/m²/day. A height h1 of the bump 140 may be less than or equal to a spacing H between the first substrate 110 and the second substrate 120. In some embodiments, a ratio of the height h1 of the bump 140 to the spacing H falls in a range of 0.5 to 1. The spacing H between the first substrate 110 and the second substrate 120 may provide a path for water vapor to enter the display layer 130 from outside. Although the sealing material 150 is filled between the first substrate 110 and the second substrate 120, and the sealing material 150 is located outside the boundary of the display layer 130, which initially blocks the water vapor from outside, some water vapor may still penetrate into the display layer 130 through the sealing material 150 and/or the interface between the sealing material 150 and other elements (for example, the first substrate 110 and the second substrate 120). Since the display device 100 of this embodiment includes not only the sealing material 150 but also the bump 140 that has a lower water vapor transmission rate, and the ratio of the height h1 of the bump 140 to the spacing H falls in the range of 0.5 to 1, penetration of water vapor in the lateral direction is reduced, and the water vapor barrier effect of the display device 100 is improved. As shown in FIG. 1, the bump 140 has a closed annular shape, which enhances the water vapor barrier effect. However, in some embodiments, the bump 140 may not be in a closed annular shape and may be selectively cut into a plurality of independent portions.

Figure 3:
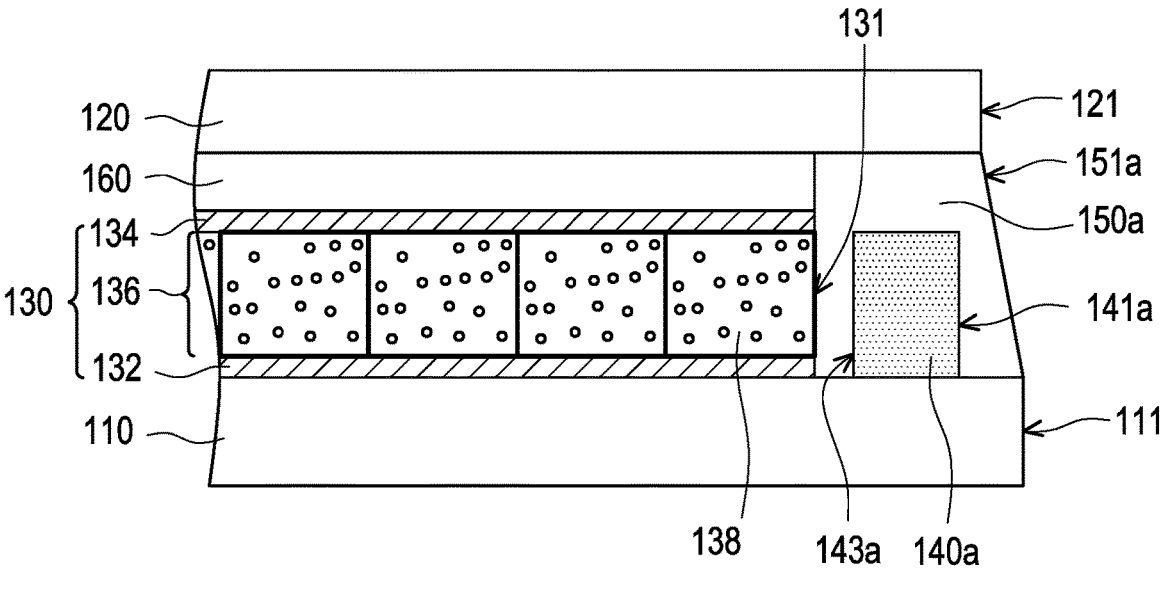
FIG. 3 is a schematic cross-sectional view of a display device according to another embodiment of the disclosure.

FIG. 3 is a schematic cross-sectional view of a display device according to another embodiment of the disclosure.

Please refer to FIG. 3. A display device 100a of FIG. 3 is similar to the display device 100 of FIG. 1, and the difference therebetween is that the bump 140a of the display device 100a is connected to the first substrate 110. The bump 140a is connected to the first substrate 110 and protrudes in a direction toward the opposite second substrate 120. Therefore, the sealing material 150a is filled between the bump 140a and the display layer 130 and between the bump 140a and the second substrate 120. The first sidewall 141a of the bump 140a is located between the boundary 131 of the display layer 130 and the sidewall 121 of the second substrate 120. By fabricating the bump 140a on the first substrate 110, and filling the sealing material 150a in the gap between the bump 140a and the display layer 130 and the gap between the bump 140a and the second substrate 120, the first substrate 110, the second substrate 120, the bump 140a, and the sealing material 150a together cover the display layer 130 and seal the display layer 130 to achieve the water vapor barrier effect. The second sidewall 151a of the sealing material 150a may be located between the first sidewall 141a of the bump 140a and the sidewall 111 of the first substrate 110. The sealing material 150a covers the first sidewall 141a and the inner sidewall 143a of the bump 140a.

Figure 4:
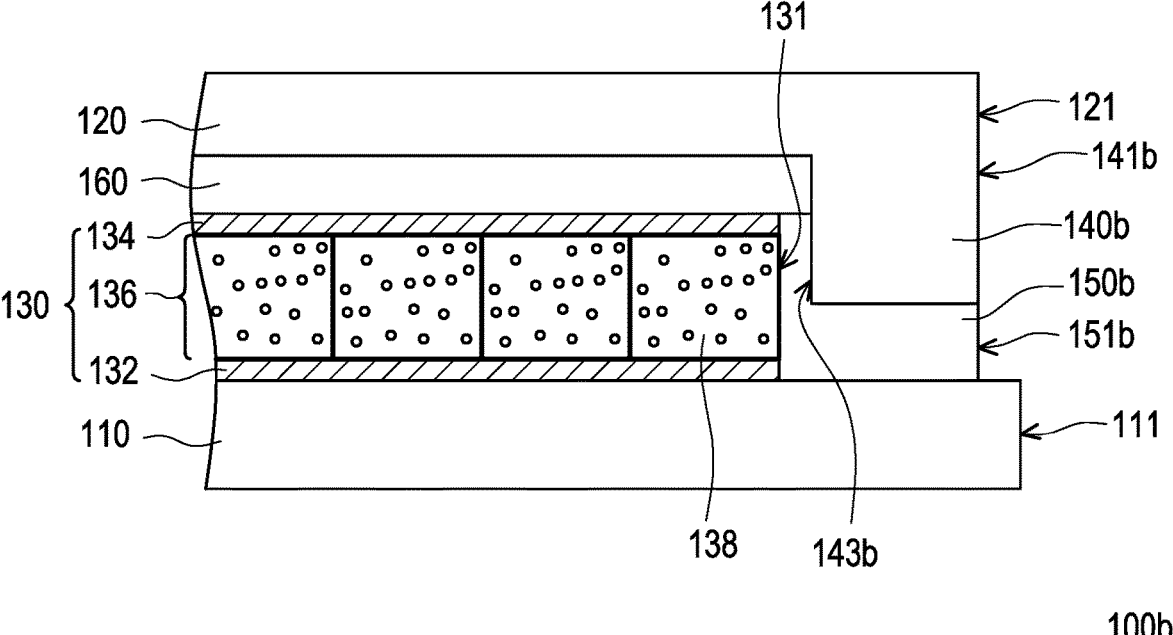
FIG. 4 is a schematic cross-sectional view of a display device according to yet another embodiment of the disclosure.

FIG. 4 is a schematic cross-sectional view of a display device according to yet another embodiment of the disclosure. Please refer to FIG. 4. A display device 100b of FIG. 4 is similar to the display device 100 of FIG. 1, and the difference therebetween is that the bump 140b is integrally formed with the second substrate 120. Here, integral forming means that there is no interface between different materials or structures between the bump 140b and the second substrate 120. For example, in the process of fabricating the second substrate 120 made of a glass material, the thickness of the edge region is set greater than the thickness of the central region so as to form a glass cover plate with a "U"-shaped cross section and a continuous body, and the protruding portion is the bump 140b integrally formed with the second substrate 120, which also achieves the water vapor barrier effect of the bump 140 shown in FIG. 2. Integrally forming the bump 140b also eliminates the interface between the second substrate 120 and the bump 140b and improves the water vapor barrier effect.

In the embodiment of FIG. 4, the sealing material 150b fills the gap between the bump 140b and the first substrate 110. The sealing material 150b covers the inner sidewall 143b of the bump 140b. The second sidewall 151b of the sealing material 150b and the first sidewall 141b of the bump 140b may overlap each other and, for example, are located on the same plane. In other embodiments, the sealing material 150b may extend along the surface of the first substrate 110 and protrude outward relative to the bump 140b due to the fluidity of the sealing material 150b before curing. Therefore, the second sidewall 151b of the sealing material 150b may be located between the first sidewall 141b of the bump 140b and the sidewall 111 of the first substrate 110, but the disclosure is not limited thereto. Since the sealing material 150b fills the gap in the vertical direction between the bump 140b and the display layer 130 and fills the gap in the horizontal direction between the bump 140b and the first substrate 110 to form a sealing body with a substantially L-shaped cross section, the bump 140b and the sealing material 150b together cover the display layer 130 in the lateral direction.

Figure 5:
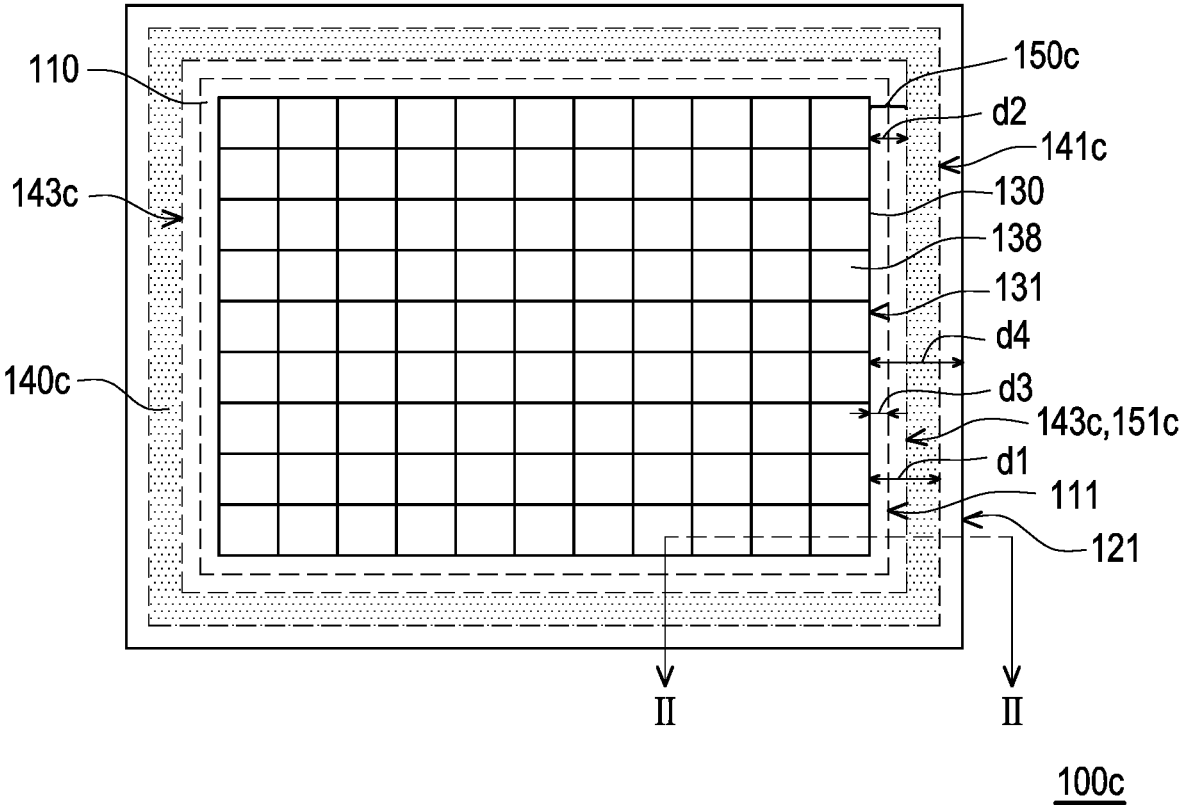
FIG. 5 is a schematic top view of some components of a display device according to an embodiment of the disclosure.
Figure 6:
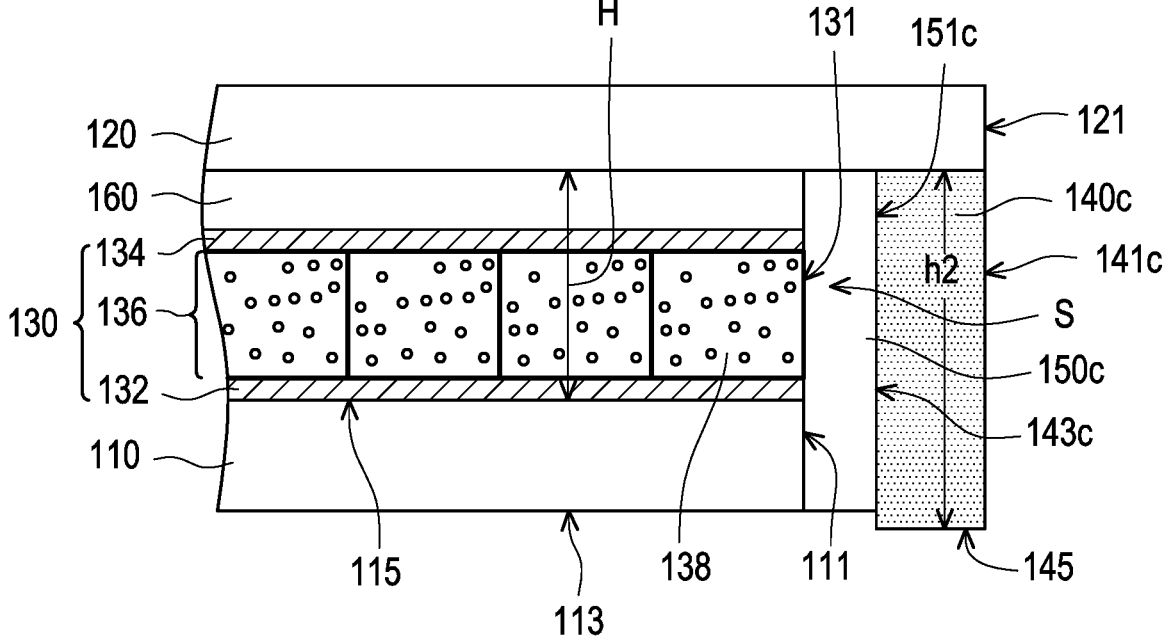
FIG. 6 is a schematic cross-sectional view of the display device of FIG. 5 cut along the line II-II.

FIG. 5 is a schematic top view of some components of a display device according to an embodiment of the disclosure. FIG. 6 is a schematic cross-sectional view of the display device of FIG. 5 cut along the line II-II. Please refer to FIG. 5 and FIG. 6. In this embodiment, a display device 100c includes a first substrate 110, a second substrate 120, a display layer 130, bump 140c, and a sealing material 150c. The second substrate 120 is disposed over the first substrate 110. The display layer 130 is disposed between the first substrate 110 and the second substrate 120 and includes a plurality of pixel units 138. The bump 140c is connected to the second substrate 120 and protrudes in a direction toward the opposite first substrate 110. The sealing material 150c is located in a space S defined by the first substrate 110, the bump 140c, and the second substrate 120, and the display layer 130 is also located in the space S such that the sealing material 150c is surrounded by the first substrate 110, the bump 140c, the second substrate 120, and the display layer 130, and the gaps in the space S other than the display layer 130 are filled with the sealing material 150c. A height h2 of the bump 140c is greater than a spacing H between the first substrate 110 and the second substrate 120. In addition, a water vapor transmission rate of the bump 140c is less than a water vapor transmission rate of the sealing material 150c. Accordingly, the bump 140c helps to improve the lateral water vapor blocking capability, which prevents water vapor from causing adverse effects to the display layer 130 and thereby ensures the quality and service life of the display device 100c.

Furthermore, the bump 140c has an end surface 145 away from the second substrate 120, and the first substrate 110 has a bottom surface 113 away from the display layer 130. In this embodiment, the end surface 145 of the bump 140c is located under the bottom surface 113 of the first substrate 110. That is, the bump 140c extends from the second substrate 120 toward the first substrate 110 beyond the bottom surface 113 of the first substrate 110. In other embodiments, the height of the end surface 145 of the bump 140c may also be located between a top surface 115 and the bottom surface 113 of the first substrate. Since the bump 140c extends from the second substrate 120 toward the first substrate 110 beyond the display layer 130, that is, the bump 140c completely covers the boundary 131 of the display layer 130 in a direction perpendicular to the thickness of the display layer 130 (that is, the lateral direction of the display device 100c), a good water vapor barrier effect is achieved.

According to FIG. 5, in this embodiment, a distance d4 between the sidewall 121 of the second substrate 120 and the boundary 131 is greater than a distance d3 between the sidewall 111 of the first substrate 110 and the boundary 131. The bump 140c and the sealing material 150c are both disposed between the sidewall 121 of the second substrate 120 and the boundary 131 of the display layer 130, for example. In other words, the sidewall 121 of the second substrate 120 is located outside the sidewall 111 of the first substrate 110. The bump 140c has an inner sidewall 143c relatively close to the display layer 130, and the inner sidewall 143c surrounds but does not contact the sidewall 111 of the first substrate 110. In other words, according to the top view of FIG. 5, the inner sidewall 143c of the bump 140c is located outside the sidewall 111 of the first substrate 110. Therefore, as shown in FIG. 6, the bump 140c may extend beyond the bottom surface 113 of the first substrate 110 to block the path of the water vapor penetrating into the space S defined by the first substrate 110, the bump 140c, and the second substrate 120 so as to achieve a good water vapor barrier effect.

The bump 140c has a first sidewall 141c away from the display layer 130, the sealing material 150c has a second sidewall 151c away from the display layer 130, and a distance d1 between the first sidewall 141c and the boundary 131 is greater than a distance d2 between the second sidewall 151c and the boundary 131. That is, the sealing material 150c is only filled on the inner side of the inner sidewall 143c of the bump 140c, and does not extend outward to the first sidewall 141c (which can be regarded as the outer sidewall) of the bump 140c. The sealing material 150c is disposed between the boundary 131 and the inner sidewall 143c, and in this embodiment, the sealing material 150c fills the gap between the bump 140c and the first substrate 110, which improves the effect that the first substrate 110, the bump 140c, the second substrate 120, and the sealing material 150c together prevent water vapor from penetrating into the display layer 130.

To sum up, in the display device according to the embodiment of the disclosure, the water vapor transmission rate of the bump is less than the water vapor transmission rate of the sealing material, which reduces the water vapor that penetrates into the display layer from outside and improves water vapor barrier effect of the display device.

What is claimed is:

1. A display device, comprising:
a first substrate;
a second substrate disposed over the first substrate, wherein
the second substrate has a lateral dimension greater than the first substrate;
a display layer disposed between the first substrate and the second substrate, and the display layer having a boundary;
a bump connected to the second substrate and protruding in a direction toward the opposite second first substrate, and
the bump being disposed around the boundary and laterally spaced from the first substate in a top view of the display device;
and a sealing material filled between the bump and the display layer,
wherein a water vapor transmission rate of the bump is less than a water vapor transmission rate of the sealing material,
the sealing material is located in a space defined by the first substrate, the bump, and the second substrate, and a maximum height of the bump, measured from the second substrate to which the bump is connected in a direction toward the first substrate, is greater than a minimum vertical distance between an inner surface of the first substrate and an inner surface of the second substrate.

2. The display device according to claim 1, wherein the bump is formed with a complete and unbroken annular pattern.

3. The display device according to claim 1, wherein the sealing material is filled between the bump and the first substrate or the second substrate.

4. The display device according to claim 1, wherein the bump is in a closed annular shape.

5. The display device according to claim 1, wherein the display layer comprises:
a first electrode disposed on the first substrate;
a second electrode disposed over the first electrode;
a display medium layer disposed between the first electrode and the second electrode; and
an optical adhesive layer disposed between the display layer and the second substrate.

6. The display device according to claim 1, wherein the water vapor transmission rate of the bump is 0.1 g/m2/day to 10 g/m2/day.

7. The display device according to claim 1, wherein the bump is integrally formed with the first substrate or the second substrate.

8. The display device according to claim 1, wherein the display layer has a boundary, and a distance between a sidewall of the second substrate and the boundary is greater than a distance between a sidewall of the first substrate and the boundary.

9. The display device according to claim 1, wherein the display layer has a boundary, the bump has a first sidewall away from the display layer, and the sealing material has a second sidewall away from the display layer, and
a distance between the first sidewall and the boundary is greater than a distance between the second sidewall and the boundary.

* * * * *